United States Patent
Potlapalli et al.

(10) Patent No.: US 6,795,010 B1
(45) Date of Patent: Sep. 21, 2004

(54) TECHNIQUES FOR PAUSING AND RESUMING ANALOG-TO-DIGITAL SIGNAL CONVERSION

(75) Inventors: Yasho Potlapalli, Cary, NC (US); Octavian Beldiman, Durham, NC (US); Takashi Fujita, Hyogo (JP)

(73) Assignee: Renesas Technology America, Inc., San Jose, CA (US)

( * ) Notice: Subject to any disclaimer, the term of this patent is extended or adjusted under 35 U.S.C. 154(b) by 0 days.

(21) Appl. No.: 10/629,390

(22) Filed: Jul. 29, 2003

(51) Int. Cl.[7] .............................................. H03M 1/12
(52) U.S. Cl. ..................................... 341/155; 341/141
(58) Field of Search ................................ 341/155, 156, 341/162.5, 141

(56) References Cited

U.S. PATENT DOCUMENTS

| | | | |
|---|---|---|---|
| 3,990,004 A | * 11/1976 | Newton | ...................... 324/612 |
| 5,291,197 A | * 3/1994 | Abe | ........................... 341/141 |
| 5,302,952 A | 4/1994 | Campbell, Jr. et al. | |
| 6,486,809 B1 | * 11/2002 | Figoli | ........................ 341/141 |
| 6,507,298 B1 | * 1/2003 | Barrenscheen et al. | ..... 341/141 |

* cited by examiner

*Primary Examiner*—Brian Young
*Assistant Examiner*—John B Nguyen
(74) *Attorney, Agent, or Firm*—Burns Doane Swecker & Mathis LLP

(57) ABSTRACT

Techniques are described for analog-to-digital signal conversion. According to exemplary embodiments, a first request is associated with a plurality of input terminals and a second request is associated with one of the input terminals. An analog signal presented at each of a portion of the input terminals associated with the first request is converted in succession into a digital value until the one of the input terminals associated with the second request is reached. A predetermined amount of time is waited to receive the second request. An analog signal presented at each of a remaining portion of the input terminals associated with the first request is converted in succession into a digital value when one of an expiration of the predetermined amount of time and a receiving of the second request occurs.

21 Claims, 3 Drawing Sheets

TECHNIQUES FOR PAUSING AND
RESUMING ANALOG-TO-DIGITAL SIGNAL
CONVERSION

BACKGROUND

Microcontroller units (or MCUs) can be used in wide variety of applications to control the operation of complex systems. For example, an MCU can be used in an automotive environment to control the operation of vehicle subsystems, such as an inflatable restraint system or a climate control system. When used in such environments, the MCU can be required to monitor the operation of system components by measuring (or sampling) signals used or produced by the components. Often these signals can be analog signals, which are generally defined as signals that are time-varying and continuous.

The analog signals can be sampled and the samples converted to digital values (logical "ones" and "zeroes") using an analog-to-digital (A/D) converter. The A/D converter can be included on an integrated circuit (IC) chip along with the MCU, and the digital values produced by the A/D converter can be used by the MCU to monitor and control the operation of the components. The number of analog signals that can be required to be converted into digital values to monitor and control the operation of a complex system can be great. An MCU IC chip can include a large number of input pins (or terminals) to receive the analog signals.

A single "on-chip" A/D converter can be used to sample the analog signals presented at several of the input terminals. A control signal, often referred to as a "trigger", can be used to initiate a conversion. The A/D converter can be configured to operate in a particular manner (or mode) prior to the occurrence of a triggering event. For example, the A/D converter can be configured prior to the occurrence of multiple triggering events to sequentially convert the analog signals presented at several of the input terminals (referred to here as a "sweep" mode). The A/D converter can also be configured to convert the analog signal presented at only one of the input terminals (referred to here as a "one-shot" mode), such that the later occurrence of multiple triggering events can result in the repeated conversion of the analog signal presented at the one input terminal.

Some applications can require a capability to convert the analog signals presented at two or more inputs with relative precise timing. To accomplish this, A/D converters operating in the sweep mode can be configured to pause after converting the analog signal presented at one of the input terminals included in the sweep, and to wait for a second occurrence of the trigger to occur to resume and complete the sweep. U.S. Pat. No. 5,302,952 to Campbell, Jr., et al. describes an A/D conversion module and method to minimize software involvement by providing a pause capacity. U.S. Pat. No. 5,291,197 to Abe describes a one-chip data processor with built-in A/D converter for automatically repeating A/D conversions without instructions from a central processing unit (CPU).

SUMMARY

Techniques are disclosed for analog-to-digital signal conversion. According to an exemplary embodiment, a first request is associated with a plurality of input terminals and a second request is associated with one of the input terminals. An analog signal presented at each of a portion of the input terminals associated with the first request is converted in succession into a digital value until the one of the input terminals associated with the second request is reached. A predetermined amount of time is waited to receive the second request. An analog signal presented at each of a remaining portion of the input terminals associated with the first request is converted in succession into a digital value when one of an expiration of the predetermined amount of time and a receiving of the second request occurs.

BRIEF DESCRIPTION OF THE DRAWINGS

The accompanying drawings provide visual representations which will be used to more fully describe the representative embodiments disclosed here and can be used by those skilled in the art to better understand them and their inherent advantages. In these drawings, like reference numerals identify corresponding elements, and.

DETAILED DESCRIPTION

Various aspects will now be described in connection with exemplary embodiments, including certain aspects described in terms of sequences of actions that can be performed by elements of a computer system. For example, it will be recognized that in each of the embodiments, the various actions can be performed by specialized circuits or circuitry (e.g., discrete and/or integrated logic gates interconnected to perform a specialized function), by program instructions being executed by one or more processors, or by a combination of both. The various aspects can thus be embodied in many different forms, and all such forms are contemplated to be within the scope of what is described. For each of the various aspects, any such form of embodiment can be referred to here as "logic configured to" perform, or "logic that" performs a described action.

Figure 1:
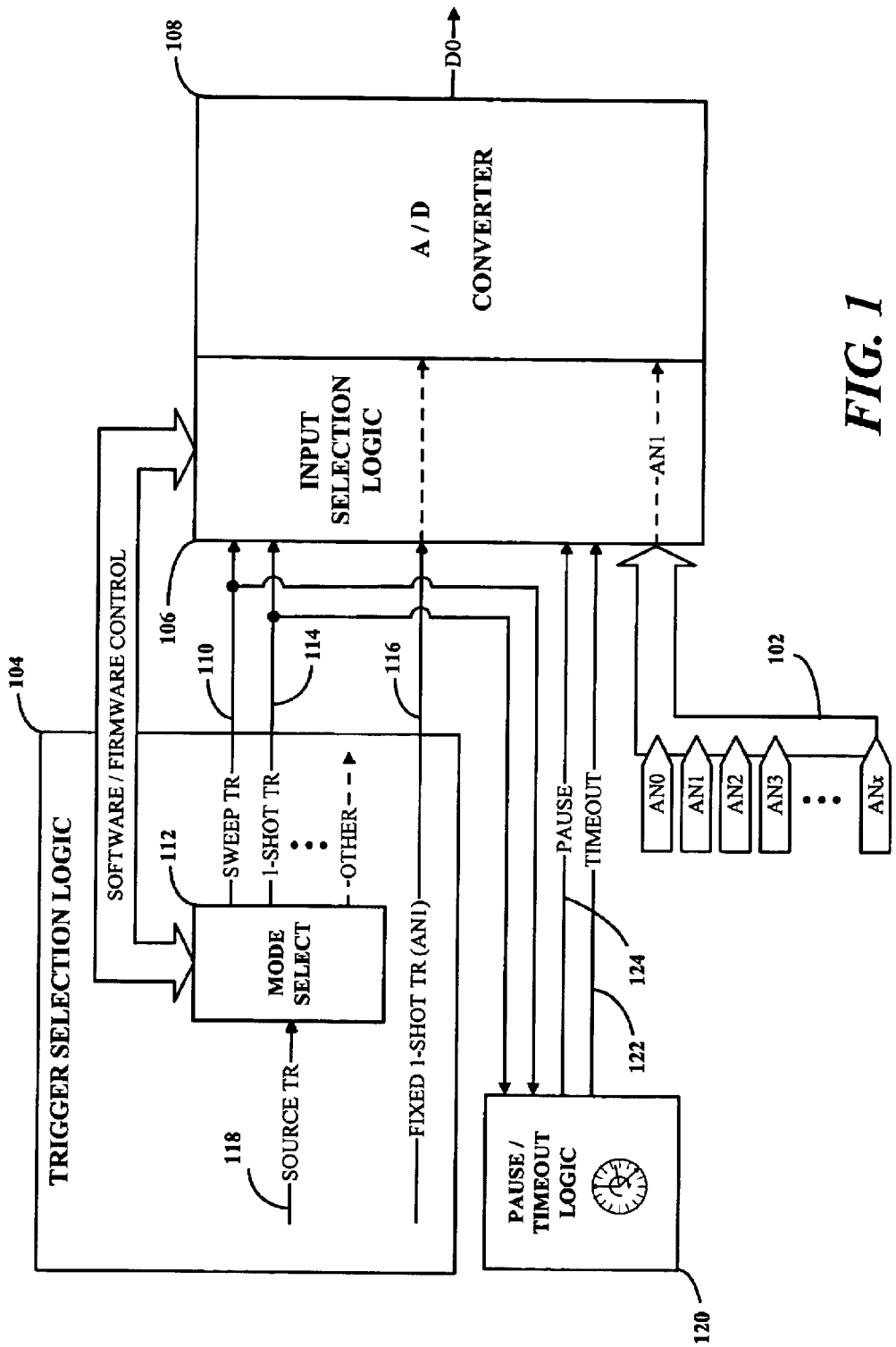
FIG. 1 illustrates a system for analog-to-digital signal conversion according to an exemplary embodiment.

An exemplary system for analog-to-digital signal conversion is shown in FIG. 1. The system includes logic configured to associate a first request with a plurality of input terminals. For example, FIG. 1 shows a plurality of input terminals 102 labeled AN0 through ANx coupled to a data bus. Each of the input terminals 102 can be configured to receive a corresponding analog signal for conversion into a digital value D0 by an A/D converter 108. The input terminals 102 can be the input pins of an MCU IC chip (not shown) that includes the A/D converter 108. For example, the system can include trigger selection logic 104 that can be included on an MCU IC chip along with the A/D converter 108.

As used here, a "request" can be a trigger signal used by the A/D converter 108 to initiate a conversion of an analog signal presented at one of the input terminals 102 into the digital value D0. Different requests (or trigger signals) can be generated from at least one trigger source 118 using mode select logic 112. The at least one trigger source 118 can be a signal generated using software (e.g., using a timer) or can be generated by hardware or logic that can be included either on or external to the MCU IC chip. Software or firmware can be used to define the request generated from the at least one trigger source 118. For example, the mode select logic 118 can be configured using software or firmware to generate the first request corresponding to a sweep trigger for operating the A/D converter 108 in a sweep mode as described above.

According to an exemplary embodiment, the plurality of input terminals associated with the first request can be changeable prior to an occurrence of the first request. For example, the changeable plurality can include any two or more of the input terminals 102, e.g., AN0–AN3, and can include all of the input terminals 102. As used here, "changeable" means that the number and/or sequence of the input terminals 102 that form the changeable plurality can be redefined before an occurrence of the first request.

For example, consider the task of performing a sequential conversion (or a sweep) of the analog signals presented at a set of four input terminals AN0–AN3. Prior to the occurrence of a sweep trigger on the sweep trigger signal line 110, software or firmware can be used to configure the input selection logic 106 coupled to the A/D converter 108 to define a starting input terminal 102 for the sweep, e.g., AN0, and a number of sequential input terminals 102 included in the sweep, e.g., four. Software or firmware can be used to reconfigure the input selection logic 106 to convert the analog signals presented at a different set of the input terminals 102 prior to a next occurrence of the sweep trigger.

The system also includes logic configured to associate a second request with one of the input terminals. For example, the mode select logic 118 can be configured using software or firmware to generate the second request from the at least one trigger source 118. The second request can correspond to a one-shot trigger for operating the A/D converter 108 in a one-shot mode as described above.

According to an exemplary embodiment, the one of the input terminals associated with the second request can be either changeable or fixed prior to an occurrence of the second request. For example, consider the task of performing a single conversion (or one-shot) of the analog signal presented at one of the input terminals AN3. When the one of the input terminals is "changeable", software or firmware can be used to configure the input selection logic 106 coupled to the A/D converter 108 to define the single input terminal 102 associated with the one-shot conversion, e.g., AN3 prior to the occurrence of a one-shot trigger on the one-shot trigger signal line 114. Software or firmware can be used to reconfigure the input selection logic 106 to convert the analog signal presented at a different one of the input terminals 102 prior to a next occurrence of the one-shot trigger.

When the one of the input terminals associated with the second request is "fixed", the input terminal cannot be redefined before an occurrence of the second request in the same manner when the one of the input terminals is changeable. For example, FIG. 1 shows a one-shot trigger signal generated by the trigger selection logic 104 carried over the one-shot trigger signal line 116. The one-shot trigger signal can be associated with a fixed one of the input terminals 102, e.g., AN1. The dashed lines in the figure indicate that the fixed one of the input terminals AN1 cannot be redefined in the same manner as can the changeable one input terminal associated with the second request, e.g., using software or firmware in conjunction with the input selection logic 106.

The total time associated with converting an analog signal presented at the fixed one of the input terminals can be less than the total time associated with converting an analog signal presented at the changeable one of the input terminals. The reduction in conversion time can result from eliminating the need to specify the input terminal prior to performing the conversion. While a fixed one of the input terminals cannot be redefined in the same manner as can a changeable one of the input terminals, it should be understood that any one of the input terminals 102 can be a "fixed" input terminal associated with the second request, e.g., through appropriate hardware configuration.

The system also includes a converter coupled to the input terminals and to the logic configured to associate and receive, such as the A/D converter 108 shown in FIG. 1. The converter is configured to convert an analog signal presented at each of a portion of the input terminals associated with the first request in succession into a digital value until the one of the input terminals associated with the second request is reached. The converter can be of any suitable design, the specific details of which are well known to those skilled in the art and are beyond the scope of this disclosure.

The converter can also be configured to receive the first and second requests on respective signal lines. For example, FIG. 1 shows the different requests, corresponding to a changeable plurality, changeable one, or fixed one of the input terminals 102, being carried to the input selection logic 106 and/or the A/D converter 108 over separate sweep trigger 110, changeable one-shot trigger 114, and fixed one-shot trigger 116 signal lines. Accordingly, the A/D converter 108 can be simultaneously armed at any given time to receive any of the requests.

Figure 2:
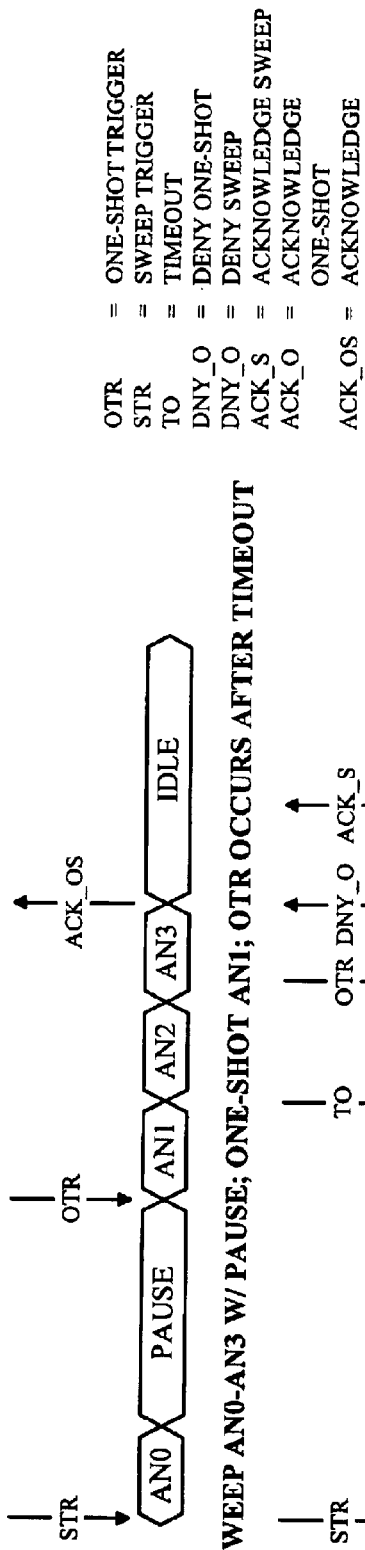
FIG. 2 illustrates exemplary timing diagrams associated with the conversion of signals using the system of FIG. 1.
Figure 2:
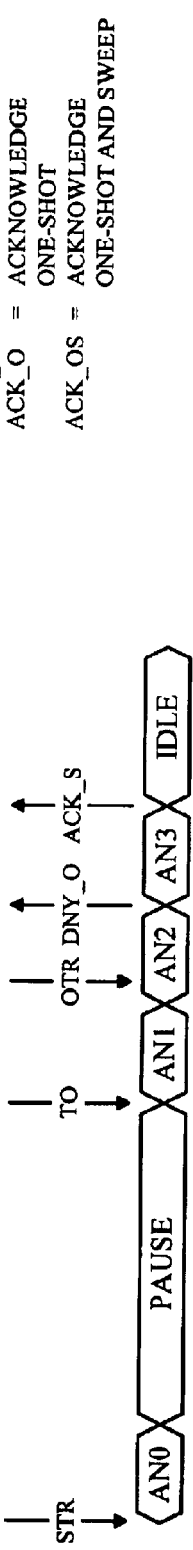
Figure 2:
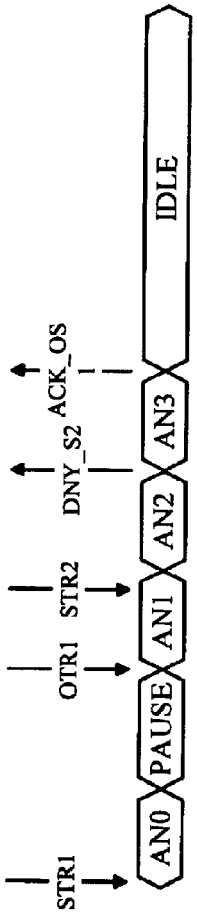
Figure 2:
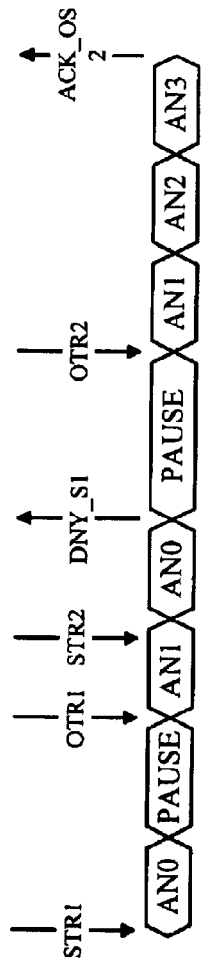

FIG. 2 shows four timing diagrams in which a first request is associated with a sweep conversion of the analog signals presented at a group of input terminals AN0–AN3, and a second request is associated with a one-shot conversion of the analog signal presented the input terminal AN1. The first request corresponds to a sweep trigger (STR) and the second request corresponds to a one-shot trigger (OTR), as shown in the figure. The STR can be associated with a changeable plurality of the input terminals 102 and the OTR can be associated with either a changeable or a fixed one of the input terminals 102 as described above.

In the first timing diagram shown in FIG. 2, the sweep conversion of the analog signals presented at the group of input terminals AN0–AN3 in succession begins with the occurrence of the STR. The analog signal presented at the first input terminal AN0 in the group is converted. The sweep conversion stops when the input terminal AN1 associated with the second request is reached. Accordingly, AN0 corresponds in the example to the portion of the input terminals associated with the first request.

The system also includes logic configured to wait a predetermined amount of time to receive the second request. For example, in FIG. 1 pause/timeout logic 120 can include timer logic coupled to the trigger and input selection logic 104, 106. The pause/timeout logic 120 can be configured to wait the predetermined amount of time to receive the second request. The timer logic can be configured to start a timer corresponding to the predetermined amount of time when the first request occurs on the sweep trigger signal line 110. The pause/timeout logic 120 can then send a pause signal to the input selection logic 106 over the pause signal line 122. The pause signal can be used by the input selection logic 106, together with information provided by software or firmware, to pause the sweep conversion of the analog signals presented at the input terminals AN0–AN3 associated with the first request when the input terminal AN1 associated with the second request is reached.

The converter is further configured to convert an analog signal presented at each of a remaining portion of the input terminals associated with the first request in succession into a digital value when one of an expiration of the predetermined amount of time and a receiving of the second request occurs. Accordingly, in the event that the second request does not occur, the analog signals presented at the remaining portion of the input terminals associated with the first request will be converted at the expiration of the predetermined amount of time. For example, in the first timing diagram shown in FIG. 2, the second request (or the OTR for AN1) occurs before the expiration of the predetermined amount of time, and the analog signals presented at the remaining portion of input terminals (AN1–AN3) are converted in succession.

In the second timing diagram shown in FIG. 2, the expiration of the predetermined amount of time (indicated by the timeout occurrence TO) occurs before the second request (or OTR), and the remaining portion of input terminals (AN1–AN3) are again converted in succession. Referring to FIG. 1, the timer logic included in the pause/timeout logic 120 can be configured to stop the timer corresponding to the predetermined amount of time when (or if) the second request occurs on the one-shot trigger signal line 114. The pause/timeout logic 120 can send a timeout signal to the input selection logic 106 over the timeout signal line 124 when the time between the occurrences of the first and second requests exceeds the predetermined amount of time. The timeout signal can be used by the input selection logic 106, together with information provided by software or firmware, to continue the sweep conversion of the analog signals presented at the input terminals AN0–AN3 associated with the first request.

According to an exemplary embodiment, when the receiving of the second request occurs before the expiration of the predetermined amount of time, the system can include logic configured to acknowledge a completion of the second request when the converting of the analog signal presented at each of the input terminals associated with the first request is complete. For example, in the first timing diagram of FIG. 2 the OTR requesting the conversion of AN1 occurs before the expiration of the predetermined amount of time. An acknowledgement ACK_OS of the successful completion of both the one-shot of AN1 and the sweep of AN0–AN3 can be made at the end of the sweep. The combined acknowledgement ACK_OS can also signify a successful exit from a pause state of the sweep conversion.

When the receiving of the second request occurs after the expiration of the predetermined of amount of time, the system can include logic configured to deny the second request when received before completing the converting of the analog signal presented at each of the input terminals associated with the first request.

For example, in the second timing diagram of FIG. 2 the OTR requesting the conversion of AN1 occurs after the expiration of the predetermined amount of time, but before completion of the conversion of the analog signal presented at the last input terminal AN3 in the sweep. Because the conversion of AN1 occurs as a result of the expiration of the predetermined amount of time rather than the occurrence of the OTR, the OTR can be said to have been effectively ignored and a denial DNY_O of the one-shot request can be issued. An acknowledgement ACK_S of a completion of the sweep can be issued when the sweep completes. The denial DNY_O and/or the acknowledgement ACK_S can signify a unsuccessful exit from a pause state of the sweep conversion.

It should be understood that if the OTR occurring after the expiration of the predetermined amount of time also occurs after the current sweep has ended, the OTR can be processed as a one-shot trigger unrelated to a pause state and acknowledged by the logic, accordingly.

According to another exemplary embodiment, a third request associated with a plurality of input terminals can be received while converting the analog signal presented at each of the remaining portion of the input terminals associated with the first request. Under such conditions, the system can include logic configured to determine a priority between the converting of the analog signal presented at each of the remaining portion of the input terminals associated with the first request and the third request. The third request can be received by the input selection logic 106 on the same sweep trigger line 110 as the first request, or on a separate sweep trigger line (e.g., the "other" trigger shown in the figure).

When the converting of the analog signal presented at each of the remaining portion of the input terminals associated with the first request has the priority, the system can include logic configured to deny the third request. For example, in the third timing diagram shown in FIG. 2, a first one-shot trigger OTR1 (or second request) occurs after a conversion of the analog signal presented at the input terminal AN0 in response to a first sweep trigger STR1 (or first request) associated the input terminals AN0–AN3. The occurrence the first one-shot trigger OTR1 causes the A/D converter 108 to successfully exit a pause state, and begin converting the analog signals presented at the remaining input terminals AN1–AN3.

A second sweep trigger STR2 (or third request) can occur before the converting of the analog signals presented at the remaining input terminals AN1–AN3 completes. Because in the third diagram the converting of the analog signals presented at the remaining input terminals AN1–AN3 has priority over the third request, a denial DNY_S2 of the third request (or second sweep) can be issued, and the first sweep can continue to completion. An acknowledgement ACK_OS1 of a successful completion of the first sweep can be issued when the first sweep completes. The acknowledgement ACK_OS1 can signify a successful exit from the pause state of the first sweep conversion.

When the third request has the priority, the system can include logic configured to halt the converting of the analog signal presented at each of the remaining portion of the input terminals associated with the first request. The converter can be configured to convert an analog signal presented at each of a portion of the input terminals associated with the third request in succession into a digital value until the one of the input terminals associated with the second request is reached. Thus, in fourth timing diagram of FIG. 2, when the second sweep trigger STR2 occurs, the first sweep can be halted, and a denial DNY_S1 indicating an unsuccessful completion of the first sweep can be issued. The conversion of the analog signal presented at the input terminal AN0 in response to the second sweep trigger STR2 can then begin, and a second pause state can be entered.

Additional logic can be configured to wait a second predetermined amount of time to receive a fourth request associated one of the input terminals associated with the third request. The converter can be configured to convert an analog signal presented at each of a remaining portion of the input terminals associated with the third request in succession into a digital value when one of an expiration of the second predetermined amount of time and a receiving of the fourth request occurs. For example, in the fourth timing diagram of FIG. 2, the second one-shot trigger OTR2 (or fourth request) requesting the conversion of AN1 occurs before the expiration of the second predetermined amount of time. An acknowledgement ACK_OS2 of the successful completion of both the one-shot of AN1 and the second sweep of AN0–AN3 can be made at the end of the second sweep. The combined acknowledgement ACK_OS2 can also signify a successful exit from a pause state of the second sweep conversion.

Figure 3:
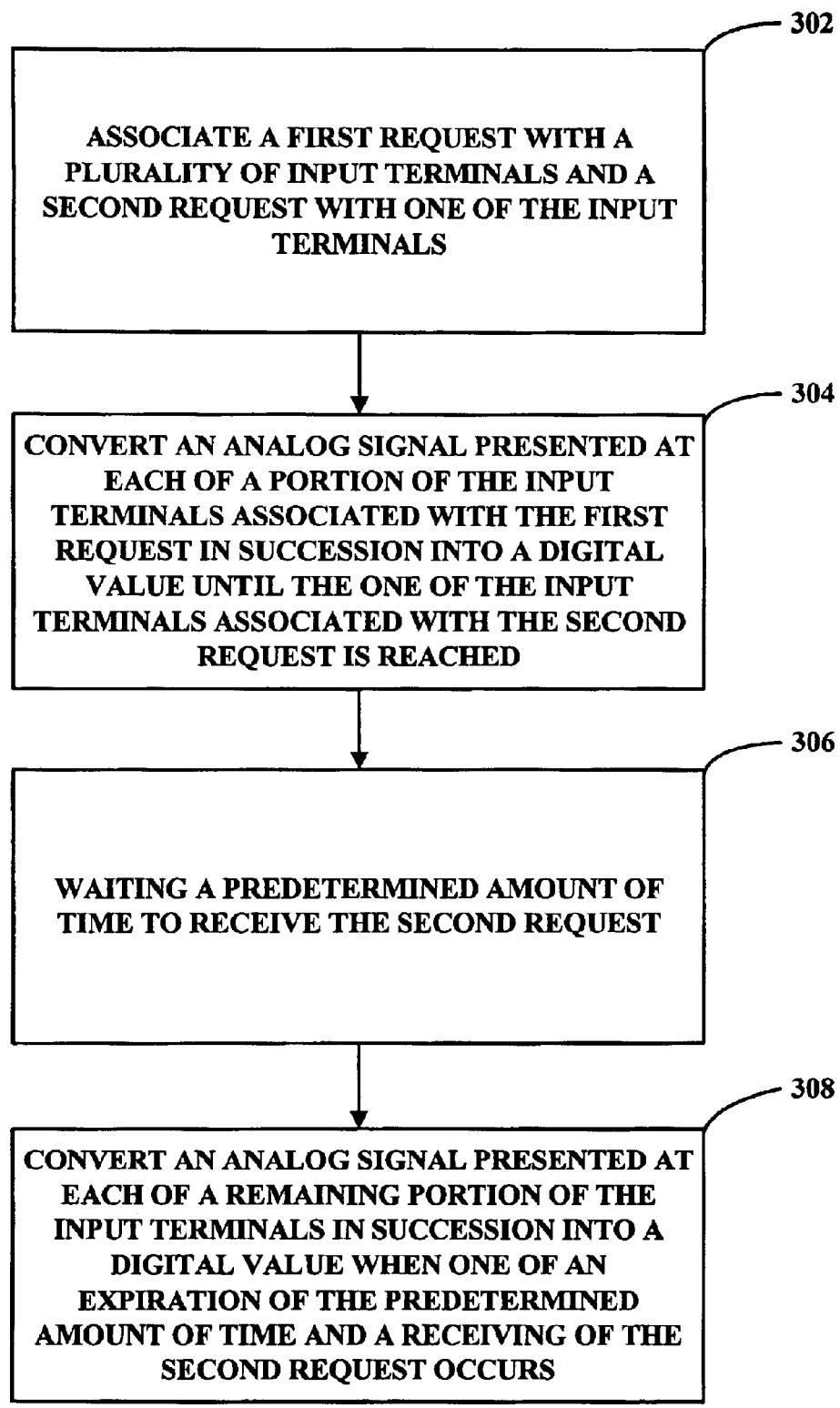
FIG. 3. is a flowchart illustrating a method for analog-to-digital signal conversion according to an exemplary embodiment.

FIG. 3 is a flowchart illustrating a method for analog-to-digital signal conversion according to an exemplary embodiment. The method can be carried out using the exemplary system depicted in FIG. 1, portions of which are referenced below for illustration purposes.

In block 302, a first request is associated with a plurality of input terminals. The first request can be a sweep trigger generated using the trigger selection logic 104 shown in FIG. 1. A plurality, e.g., AN0–AN3, of the input terminals 102 can be associated with the first request using the input selection logic 106 shown in FIG. 1. Also in block 102, a second request is associated with a one of the input terminals. The second request can be a one-shot trigger associated with any one the input terminals 102. Again the trigger selection 104 and input selection 106 logic can be used to configure the second request, and to associate it with the one of the input terminals. The plurality of input terminals associated with the first request can be changeable and the one of the input terminals associated with the second request can be either changeable or fixed. The terms "changeable" and "fixed" as used here are consistent with their meanings described in conjunction with the exemplary system shown in FIG. 1.

In block 304, an analog signal presented at each of a portion of the input terminals associated with the first request is converted in succession into a digital value until the one of the input terminals associated with the second request is reached. For example, the A/D converter 108 shown in FIG. 1 can be used to convert the analog signal, or a portion (or sample) thereof, presented at an input terminal 102 into the digital value D0. In the first timing diagram of FIG. 2, the sweep conversion of the analog signals presented at the group of input terminals AN0–AN3 in succession begins with the occurrence of the STR. The analog signal presented at the first input terminal AN0 in the group is converted. The sweep conversion stops when the input terminal AN1 associated with the second request is reached. Accordingly, AN0 corresponds in the example to the portion of the input terminals associated with the first request.

In block 306, a predetermined amount of time is waited to receive the second request. For example, the pause/timeout logic 120 of FIG. 1 can be configured to wait the predetermined amount of time to receive the second request. The logic 120 can be configured to send a pause signal to the input selection logic 106 over the pause signal line 122. The pause signal can be used by the input selection logic 106, together with information provided by software or firmware, to pause the sweep conversion of the analog signals presented at the input terminals AN0–AN3 associated with the first request when the input terminal AN1 associated with the second request is reached.

In block 308, an analog signal presented at each of a remaining portion of the input terminals associated with the first request is converted in succession into a digital value when one of an expiration of the predetermined amount of time and a receiving of the second request occurs. For example, in the first timing diagram shown in FIG. 2, the second request (or the OTR for AN1) occurs before the expiration of the predetermined amount of time, and the analog signals presented at the remaining portion of input terminals (AN1–AN3) are converted in succession. In the second timing diagram shown in FIG. 2, the expiration of the predetermined amount of time (indicated by the timeout occurrence TO) occurs before the second request (or OTR), and the remaining portion of input terminals (AN1–AN3) are again converted in succession. A timeout signal can be sent the pause/timeout logic 120 to the input selection logic 106 over the timeout signal line 124 when the time between the occurrences of the first and second requests exceeds the predetermined amount of time.

When the receiving of the second request occurs before the expiration of the predetermined amount of time, a completion of the second request can be acknowledged when the converting of the analog signal presented at each of the input terminals associated with the first request is complete. For example, in the first timing diagram of FIG. 2 the OTR requesting the conversion of AN1 occurs before the expiration of the predetermined amount of time. An acknowledgement ACK_OS of the successful completion of both the one-shot of AN1 and the sweep of AN0–AN3 can be made at the end of the sweep. The combined acknowledgement ACK_OS can also signify a successful exit from a pause state of the sweep conversion.

When the receiving of the second request occurs after the expiration of the predetermined of amount of time, the system can include logic configured to deny the second request when received before completing the converting of the analog signal presented at each of the input terminals associated with the first request. For example, in the second timing diagram of FIG. 2 the OTR requesting the conversion of AN1 occurs after the expiration of the predetermined amount of time, but before completion of the conversion of the analog signal presented at the last input terminal AN3 in the sweep. Because the conversion of AN1 occurs as a result of the expiration of the predetermined amount of time rather than the occurrence of the OTR, a denial DNY_O of the one-shot request can be issued. An acknowledgement ACK_S of a completion of the sweep can be issued when the sweep completes. The denial DNY_O and/or acknowledgement ACK_S can signify a unsuccessful exit from a pause state of the sweep conversion.

According to another exemplary embodiment, a third request associated with a plurality of input terminals can be received while converting the analog signal presented at each of the remaining portion of the input terminals associated with the first request. Under such conditions, a priority can be determined between the converting of the analog signal presented at each of the remaining portion of the input terminals associated with the first request and the third request. When the converting of the analog signal presented at each of the remaining portion of the input terminals associated with the first request has the priority, the third request can be denied. This operation is described in detail above in conjunction with the third timing diagram shown in FIG. 2.

When instead the third request has the priority, the converting of the analog signal presented at each of the remaining portion of the input terminals associated with the first request can be halted. An analog signal presented at each of a portion of the input terminals associated with the third request can be converted in succession into a digital value until the one of the input terminals associated with the second request is reached. A second predetermined amount of time can be waited to receive a fourth request associated one of the input terminals associated with the third request.

An analog signal presented at each of a remaining portion of the input terminals associated with the third request can be converted in succession into a digital value when one of an expiration of the second predetermined amount of time and a receiving of the fourth request occurs. This operation is described in detail above in conjunction with the fourth timing diagram shown in FIG. 2.

The instructions of a computer program as illustrated in FIG. 3 for analog-to-digital signal conversion can be embodied in any computer readable medium for use by or in connection with an instruction execution system, apparatus, or device, such as a computer based system, processor containing system, or other system that can fetch the instructions from the instruction execution system, apparatus, or device and execute the instructions.

As used here, a "computer readable medium" can be any means that can contain, store, communicate, propagate, or transport the program for use by or in connection with the instruction execution system, apparatus, or device. The computer readable medium can be, for example but not limited to, an electronic, magnetic, optical, electromagnetic, infrared, or semiconductor system, apparatus, device, or propagation medium. More specific examples (a non exhaustive list) of the computer readable medium can include the following: an electrical connection having one or more wires, a portable computer diskette, a random access memory (RAM), a read only memory (ROM), an erasable programmable read only memory (EPROM or Flash memory), an optical fiber, and a portable compact disc read only memory (CDROM).

It will be appreciated by those of ordinary skill in the art that the concepts and techniques described here can be embodied in various specific forms without departing from the essential characteristics thereof. The presently disclosed embodiments are considered in all respects to be illustrative and not restrictive. The scope of the invention is indicated by the appended claims, rather than the foregoing description, and all changes that come within the meaning and range of equivalence thereof are intended to be embraced.

What is claimed is:

1. A system for analog-to-digital signal conversion, the system comprising:

logic configured to associate a first request with a plurality of input terminals and a second request with one of the input terminals;

a converter configured to convert an analog signal presented at each of a portion of the input terminals associated with the first request in succession into a digital value until the one of the input terminals associated with the second request is reached; and logic configured to wait a predetermined amount of time to receive the second request;

wherein the converter is configured to convert an analog signal presented at each of a remaining portion of the input terminals associated with the first request in succession into a digital value when one of an expiration of the predetermined amount of time and a receiving of the second request occurs.

2. The system of claim 1, wherein when the receiving of the second request occurs before the expiration of the predetermined amount of time, the system comprises:

logic configured to acknowledge a completion of the second request when the converting of the analog signal presented at each of the input terminals associated with the first request is complete.

3. The system of claim 1, wherein when the receiving of the second request occurs after the expiration of the predetermined of amount of time, the system comprises:

logic configured to deny the second request when received before completing the converting of the analog signal presented at each of the input terminals associated with the first request.

4. The system of claim 1, wherein when a third request associated with a plurality of input terminals is received while converting the analog signal presented at each of the remaining portion of the input terminals associated with the first request, the system comprises:

logic configured to determine a priority between the converting of the analog signal presented at each of the remaining portion of the input terminals associated with the first request and the third request.

5. The system of claim 4, wherein when the converting of the analog signal presented at each of the remaining portion of the input terminals associated with the first request has the priority, the system comprises:

logic configured to deny the third request.

6. The system of claim 4, wherein when the third request has the priority, the system comprises:

logic configured to halt the converting of the analog signal presented at each of the remaining portion of the input terminals associated with the first request, wherein the converter is configured to convert an analog signal presented at each of a portion of the input terminals associated with the third request in succession into a digital value until the one of the input terminals associated with the second request is reached; and logic configured to wait a second predetermined amount of time to receive a fourth request associated one of the input terminals associated with the third request, wherein the converter is configured to convert an analog signal presented at each of a remaining portion of the input terminals associated with the third request in succession into a digital value when one of an expiration of the second predetermined amount of time and a receiving of the fourth request occurs.

7. The systemn of claim 1, wherein the converter is configured to receive the first and second requests on respective signal lines.

8. The system of claim 1, wherein the plurality of the input terminals associated with the first request is changeable prior to an occurrence of the first request, and the one of the input terminals associated with the second request is one of changeable and fixed prior to an occurrence of the second request.

9. A method for analog-to-digital signal conversion, the method comprising:

associating a first request with a plurality of input terminals and a second request with one of the input terminals;

converting an analog signal presented at each of a portion of the input terminals associated with the first request in succession into a digital value until the one of the input terminals associated with the second request is reached;

waiting a predetermined amount of time to receive the second request; and converting an analog signal presented at each of a remaining portion of the input terminals associated with the first request in succession into a digital value when one of an expiration of the predetermined amount of time and a receiving of the second request occurs.

10. The method of claim 9, wherein when the receiving of the second request occurs before the expiration of the predetermined amount of time, the method comprises:

acknowledging a completion of the second request when the converting of the analog signal presented at each of the input terminals associated with the first request is complete.

11. The method of claim 9, wherein when the receiving of the second request occurs after the expiration of the predetermined of amount of time, the method comprises:

denying the second request when received before completing the converting of the analog signal presented at each of the input terminals associated with the first request.

12. The method of claim 9, wherein when a third request associated with a plurality of input terminals is received while converting the analog signal presented at each of the remaining portion of the input terminals associated with the first request, the method comprises:

determining a priority between the converting of the analog signal presented at each of the remaining portion of the input terminals associated with the first request and the third request.

13. The method of claim 12, wherein when the converting of the analog signal presented at each of the remaining portion of the input terminals associated with the first request has the priority, the method comprises:

denying the third request.

14. The method of claim 12, wherein when the third request has the priority, the method comprises:

halting the converting of the analog signal presented at each of the remaining portion of the input terminals associated with the first request;

converting an analog signal presented at each of a portion of the input terminals associated with the third request in succession into a digital value until the one of the input terminals associated with the second request is reached;

waiting a second predetermined amount of time to receive a fourth request associated one of the input terminals associated with the third request; and converting an analog signal presented at each of a remaining portion of the input terminals associated with the third request in succession into a digital value when one of an expiration of the second predetermined amount of time and a receiving of the fourth request occurs.

15. The method of claim 9, wherein the plurality of the input terminals associated with the first request is changeable prior to an occurrence of the first request, and the one of the input terminals associated with the second request is one of changeable and fixed prior to an occurrence of the second request.

16. A computer readable medium containing a computer program for analog-to-digital signal conversion, wherein the computer program comprises executable instructions for:

associating a first request with a plurality of input terminals and a second request with one of the input terminals;

converting an analog signal presented at each of a portion of the input terminals associated with the first request in succession into a digital value until the one of the input terminals associated with the second request is reached;

waiting a predetermined amount of time to receive the second request; and converting an analog signal presented at each of a remaining portion of the input terminals associated with the first request in succession into a digital value when one of an expiration of the predetermined amount of time and a receiving of the second request occurs.

17. The computer readable medium of claim 16, wherein when the receiving of the second request occurs before the expiration of the predetermined amount of time, the computer program comprises executable instructions for:

acknowledging a completion of the second request when the converting of the analog signal presented at each of the input terminals associated with the first request is complete.

18. The computer readable medium of claim 16, wherein when the receiving of the second request occurs after the expiration of the predetermined of amount of time, the computer program comprises executable instructions for:

denying the second request when received before completing the converting of the analog signal presented at each of the input terminals associated with the first request.

19. The computer readable medium of claim 16, wherein when a third request associated with a plurality of input terminals is received while converting the analog signal presented at each of the remaining portion of the input terminals associated with the first request, the computer program comprises executable instructions for:

determining a priority between the converting of the analog signal presented at each of the remaining portion of the input terminals associated with the first request and the third request.

20. The computer readable medium of claim 19, wherein when the converting of the analog signal presented at each of the remaining portion of the input terminals associated with the first request has the priority, the computer program comprises executable instructions for:

denying the third request.

21. The computer readable medium of claim 16, wherein when the third request has the priority, the computer program comprises executable instructions for:

halting the converting of the analog signal presented at each of the remaining portion of the input terminals associated with the first request;

converting an analog signal presented at each of a portion of the input terminals associated with the third request in succession into a digital value until the one of the input terminals associated with the second request is reached;

waiting a second predetermined amount of time to receive a fourth request associated one of the input terminals associated with the third request; and converting an analog signal presented at each of a remaining portion of the input terminals associated with the third request in succession into a digital value when one of an expiration of the second predetermined amount of time and a receiving of the fourth request occurs.

* * * * *